(12) United States Patent
D'Oyly-Watkins

(10) Patent No.: US 10,374,597 B2
(45) Date of Patent: Aug. 6, 2019

(54) CIRCUIT STATE SENSING

(71) Applicant: BAE SYSTEMS plc, London (GB)

(72) Inventor: David Christopher D'Oyly-Watkins, Rochester (GB)

(73) Assignee: BAE SYSTEMS plc, London (GB)

(*) Notice: Subject to any disclaimer, the term of this patent is extended or adjusted under 35 U.S.C. 154(b) by 280 days.

(21) Appl. No.: 15/304,303

(22) PCT Filed: Apr. 14, 2015

(86) PCT No.: PCT/GB2015/051117
§ 371 (c)(1),
(2) Date: Oct. 14, 2016

(87) PCT Pub. No.: WO2015/159057
PCT Pub. Date: Oct. 22, 2015

(65) Prior Publication Data
US 2017/0040991 A1  Feb. 9, 2017

(30) Foreign Application Priority Data

Apr. 15, 2014 (EP) ..................................... 14275083
Apr. 15, 2014 (GB) ................................... 1406786.2

(51) Int. Cl.
H03K 17/18 (2006.01)
G01R 31/06 (2006.01)
(Continued)

(52) U.S. Cl.
CPC ............. *H03K 17/18* (2013.01); *G01R 31/06* (2013.01); *G01R 31/2621* (2013.01);
(Continued)

(58) Field of Classification Search
CPC .... H03K 17/18; G01R 31/06; G01R 31/2621; G01R 31/3277; H01F 27/28; H01F 27/34
See application file for complete search history.

(56) References Cited

U.S. PATENT DOCUMENTS 3,626,248 A    12/1971 Bartlett et al.
3,746,880 A *   7/1973 Iritani ................... G08C 19/30
                                                              307/97
(Continued)

FOREIGN PATENT DOCUMENTS

EP    0435686 A2   7/1991
EP    2237056 A1  10/2010
(Continued)

OTHER PUBLICATIONS

Bortis et al., Design and Control of an Active Reset Circuit for Pulse Transformers, 2009.*
(Continued)

*Primary Examiner* — Daniel R Miller
(74) *Attorney, Agent, or Firm* — Finch & Maloney PLLC

(57) ABSTRACT

A circuit state sensing device (100) includes a transformer (102) having a primary coil (104A) and a secondary coil (104B). In use, the secondary coil is connected to a target circuit (106) for which a state is to be sensed. The device further includes a measuring arrangement (112, 122) configured to take a measurement relating to impedance at the primary coil, and a processing arrangement (122) configured to process the impedance measurement to determine a state of the target circuit.

19 Claims, 5 Drawing Sheets

(51) Int. Cl.
*G01R 31/26* (2014.01)
*G01R 31/327* (2006.01)
*H01F 27/28* (2006.01)
*H01F 27/34* (2006.01)

(52) U.S. Cl.
CPC ......... *G01R 31/3277* (2013.01); *H01F 27/28* (2013.01); *H01F 27/34* (2013.01)

(56) References Cited

U.S. PATENT DOCUMENTS

| | | | |
|---|---|---|---|
| 4,485,342 A | | 11/1984 | Hill et al. |
| 5,083,116 A | * | 1/1992 | Judd ...................... H01H 9/167 340/644 |
| 5,096,147 A | | 3/1992 | Brohm et al. |
| 5,964,746 A | * | 10/1999 | McCary ................ A61B 50/13 606/1 |
| 6,442,422 B1 | * | 8/2002 | Duckert .................. A61N 1/08 128/908 |

FOREIGN PATENT DOCUMENTS

| | | |
|---|---|---|
| GB | 2159285 A | 12/1985 |
| JP | S58141029 A | 8/1983 |
| NL | 9201111 A | 1/1994 |
| WO | 9642098 | 12/1996 |
| WO | 9824106 | 6/1998 |
| WO | 2015159057 A1 | 10/2015 |

OTHER PUBLICATIONS

International Search Report and Written Opinion received for Patent Application No. PCT/GB2015/051117, dated Jun. 18, 2015. 14 pages.
GB Intellectual Property Office Search Report under Section 17(5) received for GB Patent Application No. 1406786.2 dated Sep. 19, 2014. 3 pages.
Extended European Search Report received for EP Patent Application No. 14275083.5 dated Oct. 9, 2014. 9 pages.
International Preliminary Report on Patentability received for Patent Application No. PCT/GB2015/051117. dated Oct. 27, 2016. 11 pages.

* cited by examiner

CIRCUIT STATE SENSING

The present invention relates to sensing a state of a circuit.

Correctly detecting the state of an electronic component can be critical in many situations. For example, a device can be provided to sense whether or not a switch related to safety-critical equipment, such as an aircraft door, is open/closed, which can have serious safety implications and so it is important to have reliable confirmation regarding the state of the switch.

Further, in many instances it is important to isolate the circuit which is to be sensed from the circuit that performs the sensing; any current/voltage leakage can result in damage or inadvertent circuit activation. Protection against electromagnetic interference (EMI) is also important for similar reasons. It can also be beneficial from a safety perspective to avoid devices that use high voltages to sense the state of a circuit.

It is also desirable to have a device for sensing the state of a circuit that is easy to implement in many different applications.

According to a first aspect of the present invention there is provided a circuit state sensing device including:

a transformer having a primary coil and a secondary coil, in use, the secondary coil being connected to a target circuit for which a state is to be sensed;

a measuring arrangement configured to take a measurement relating to impedance at the primary coil, and a processing arrangement configured to process the measurement to determine a state of the target circuit.

Embodiments of the present invention can provide a circuit that may be easily configured for switch closure or voltage sensing modes and offer complete independent galvanic isolation between the external and receiving equipment. Embodiments of the device can be inherently differential with low impedance characteristics and hence offer good immunity to EMI. Embodiments can also be scalable to handle a number of inputs with a very low component count overhead for each additional input. Embodiments of the invention can include a small transformer, one being required for each interface. This transformer can be used to both sense the state of the discrete input and to provide isolation.

In use, the target circuit may include a switch and the device can be configured to sense an open/closed state of the switch. In an alternative embodiment, in use, the target circuit can include a voltage source and the device is configured to sense a voltage state of the target circuit The device may further include a current providing arrangement to selectively provide a current to the primary coil of the transformer. The current providing arrangement may include a current control switch.

The device may include a resetting arrangement for resetting residual flux of the transformer. The resetting arrangement may comprise a fly-back diode connected across the primary coil of the transformer.

The measuring arrangement may include an arrangement for measuring a time taken for the current provided by the current providing arrangement (e.g. closing of the current control switch) to the primary coil to reach a predetermined current value.

The processing arrangement may include:

a comparison arrangement configured to compare the time measured by the measuring arrangement with a stored time value, and an output arrangement configured to generate an output signal based on a result provided by the comparison arrangement.

In some embodiments, the output arrangement generates an output signal indicating a high voltage state of the target circuit when the result provided by the comparison arrangement indicates that the measured time is less than the predetermined time.

Some embodiments of the device can be configured to sense states of a plurality of said target circuits. Such embodiments can include:

a plurality of transformers, each said transformer having a primary coil and a secondary coil, in use, the secondary coil being connected to an associated one of the plurality of target circuits;

wherein the measuring arrangement is configured to take a measurements relating to impedance at the primary coil of each of the plurality of transformers.

Such embodiments can further include:

a plurality of current providing arrangements to selectively provide a current to the primary coil of an associated one of the plurality of transformers;

a plurality of resetting arrangements for resetting residual flux of an associated one of the plurality of transformers;

wherein the measuring arrangement may include an arrangement for measuring a time taken for the current provided to the primary coil of one of the plurality of transformers by the associated current providing arrangement to reach a predetermined current value.

In such embodiments, the plurality of current providing arrangements may comprise a plurality of current control switches, which may be arranged as an analogue multiplexer.

In some embodiments, in use, the target circuit includes a voltage source and a current limit resistor, wherein a value of the current limit resistor is chosen to set a current through the secondary coil of the transformer at a value sufficient to ensure saturation of a core of the transformer when a minimum expected voltage is applied to the target circuit.

Some embodiments of the device can be configured to act as a power switch monitor in applications such as a switching system that uses two or more series switch elements for integrity in safety critical applications. In such embodiments, the target circuit includes a switch that, in use, is connected to the secondary coil of the transformer via at least one isolation capacitor. If one said isolation capacitor is used then a value of the isolation capacitor will be sufficient to ensure low impedance at an operating frequency of the device such that when the switch of the target circuit is closed, in use, a shorted condition is detected by the device. If a plurality of series said isolation capacitors are used then individual values of the capacitors will be higher than needed for a single said capacitor in order to result in the same overall impedance.

The device can be used to monitor states of a plurality of FET switches that control power from a source to a safety critical load, for instance. Each said FET switch can be associated with a respective said transformer. Isolation capacitors may be connected between the transformers and the plurality of FET switches. In use, the device can monitor states of the FET switches by using the current providing arrangement to selectively provide a current to the primary coil of one or more of the transformers in a sequence and checking if the state of each said FET switch corresponds to an expected state based on the current provided by the sequence.

According to a further aspect of the present invention there is provided a state sensing device including:

a transformer having a primary coil and a secondary coil, in use, the secondary coil being connected to a target circuit for which a state is to be sensed;

a current providing arrangement to selectively provide a current to the primary coil of the transformer;

a time measuring arrangement configured to measure time taken by the current provided to the primary coil to reach a predetermined current value whilst the current providing arrangement is providing the current;

a comparison arrangement configured to compare the time measured by the time measuring arrangement and a predetermined time, and an output arrangement configured to generate a circuit state output signal based on a result provided by the comparison arrangement.

According to another aspect of the present invention there is provided a state sensing device including:

a transformer having a primary coil and a secondary coil, in use, the secondary coil being connected to a target circuit for which a state is to be sensed;

a measuring arrangement configured to measure a time taken for a current provided to the primary coil to reach a predetermined current value, and a processing arrangement configured to process the measured time to determine a state of the target circuit.

According to yet another aspect of the present invention there is provided a circuit adapted to include a state sensing device substantially as described herein.

According to yet another aspect of the present invention there is provided a vehicle (or other body/component) including a state sensing device substantially as described herein.

According to another aspect of the present invention there is provided a method of sensing a state of a circuit, the method including:

providing a transformer having a primary coil and a secondary coil;

connecting the secondary coil to a target circuit for which a state is to be sensed;

taking a measurement relating to impedance at the primary coil, and processing the measurement to determine a state of the target circuit.

The step of taking a measurement may include:

measuring a time taken for a current provided to the primary coil to reach a predetermined current value, and the step of processing the measurement may include:

comparing the measured time with a stored time value, and outputting a state signal based on a result of the comparing.

According to a further aspect of the present invention there is provided a method of sensing a state of a circuit, the method including:

providing a transformer having a primary coil and a secondary coil;

connecting the secondary coil of the transformer to a circuit for which a state is to be sensed;

providing a current to the primary coil of the transformer;

measuring a time taken by the current across the primary coil of the transformer to reach a predetermined current value;

comparing the time measured and a predetermined time, and outputting a state signal based on a result of the comparing.

Embodiments of the present invention will now be described in more detail by way of example only and with reference to the accompanying diagrammatic drawings, of which:

Figure 1:
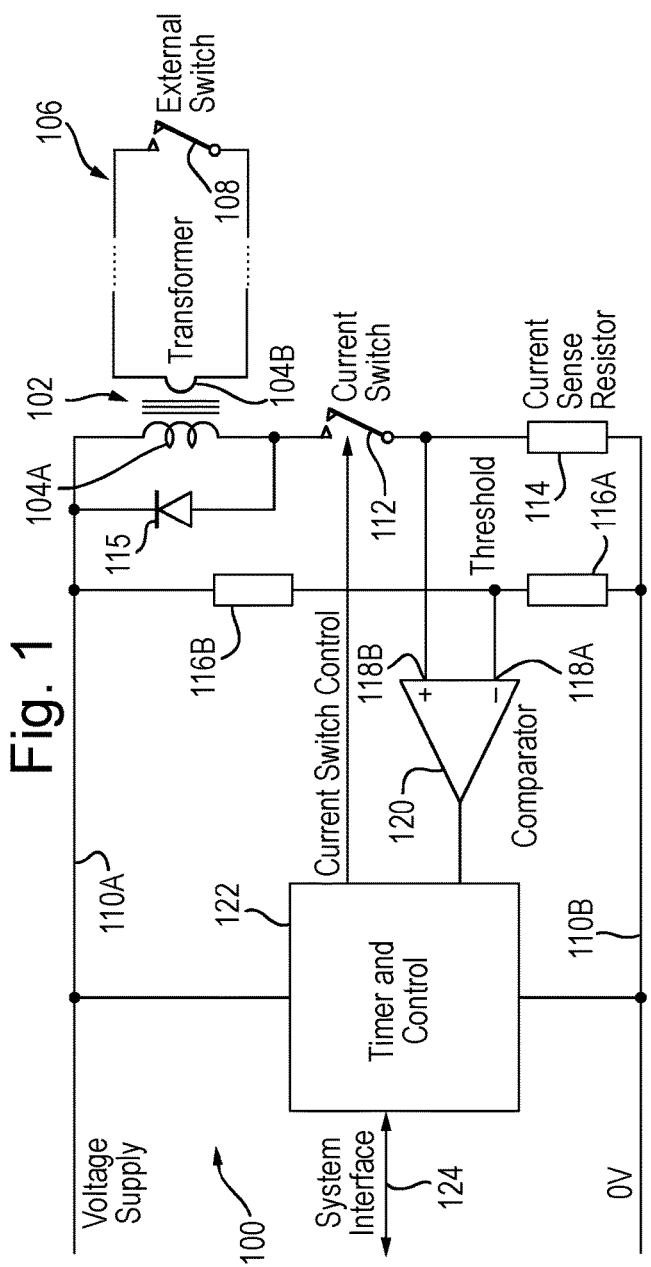
FIG. 1 is a diagram of a first example embodiment of a circuit state sensing device that is intended to detect the state of a switch.

Referring to FIG. 1, an example circuit state sensing device 100 includes a transformer 102 having a primary coil/winding 104A and a secondary coil/winding 104B. A target circuit 106 for which a state is to be sensed by the device is connected to the secondary coil. In use, the device exploits the reflected impedance and core saturation properties of the transformer to modify the impedance seen at its primary coil and provide a means to detect the state of the target circuit. The example target circuit comprises an external switch 108, which may be directly operated by a human user or in response to a mechanical, electromagnetic, hydraulic, electronic or any other suitable type of control signal. In one embodiment, the switch is one that is used to deploy/release an item from a vehicle via a door, such as the landing gear of an aircraft; however, it will be understood that embodiments of the state sensing device can work with many different types of target circuits and applications. Some examples are described below, but it will be appreciated that various kinds of target circuits, which may or may not include at least one switch, its own a voltage supply, etc., can be used in conjunction with embodiments of the circuit state sensing device.

The primary coil 104A of the transformer 102 is connected to a substantially constant voltage supply rail 110A, or to a supply whose voltage varies only within predefined ranges of rate and magnitude so as not to impart a significant variation to the characteristics being measured by the sensing device. A current control switch 112 and a current sense resistor 114 are connected between the primary coil and a ground rail 110B. A fly-back diode 115 is connected across the primary coil. As will be described below, this fly-back diode can reset the residual flux in the transformer 102 during use of the device; however, it will be appreciated that alternative components could be used to perform this function, e.g. an arrangement including a synchronous FET and a body diode that can be switched on/off in an appropriate manner.

An optional potential divider, comprising first 116A and second 116B resistors, is also connected between the supply 110A and ground 110B rails, in parallel to the primary coil 104A, the current control switch 112 and the current sense resistor 114. The potential divider is one example of a mechanism for setting the current threshold of the circuit, but it will be understood that other techniques could be used to provide this function. One input 118A of a comparator 120 is connected to the potential divider, and the other 118B input of the comparator is connected to the line between the current sense resistor and the current control switch. An output of the comparator is connected to a timer and control arrangement 122. This arrangement controls the opening/closing of the current control switch, as will be described below, and is also in communication with a system interface 124. When the device 100 senses the state of the target circuit 106 the system interface can output a signal to another component (not shown) of the device 100, or to an external device/system. Various types of signals can be output, via any suitable wired or wireless communication medium, such as a simple binary indication of the open/closed state of the switch 108 in the target circuit. Such a signal can be used to activate an alarm, for instance, or cause some other action to be performed. In some embodiments, the device may continuously or intermittently output signals that indicate the state of the target circuit.

In use, the current control switch 112 is closed, under the control of the timer and control circuit 122, to apply a voltage across the primary coil 104A and the resulting current is monitored by the device 100. The rate of increase of this current is determined by the primary impedance of the transformer 102, which, if the secondary coil 104B is unloaded, is determined by its inductance, which is set by the magnetic properties of its core. In this case, the core is not saturated (and the magnetic flux is mainly determined by the primary coil), resulting in a slower current change rate that indicates an open/low voltage target circuit. However, if the secondary coil is "shorted" by the external switch 108 being closed then the low reflected impedance will cause a noticeable increase in the rate of change of the primary current (which in effect is then only limited by the sense resistor 114, which has a value that is known to the designer). In this case, the core of the transformer can be saturated (and the magnetic flux is determined by both the primary and secondary coil), resulting in a faster current change rate that indicates a closed/high voltage target circuit.

The resistor 114 is a mechanism to convert the primary current flowing in the transformer 106 into a voltage that can be measured by the sense circuit 100. From this perspective, the resistor value should be as small as possible, but high enough to provide a signal that can be measured reliably. However, a secondary function of the resistor can be to limit the maximum current in the primary coil to a safe level in the event that the switch is closed for a long period (and in cases when the output is shorted and hence the reflected impedance is very low). For this purpose a higher value of resistance would be needed than may be required for a pure sensing function. The selection of the value for this resistor can therefore be a compromise for these two functions, indeed, the secondary function may not be needed if: a) it can be guaranteed that the current control switch will be opened as soon (or very shortly after) as the threshold current is reached or; b) some other mechanism for limiting the maximum primary current in the transformer is provided (e.g. a current limit in the supply). In other embodiments an alternative mechanism for measuring the primary current may be provided, for example, by the use of another current sense transformer.

Figure 2:
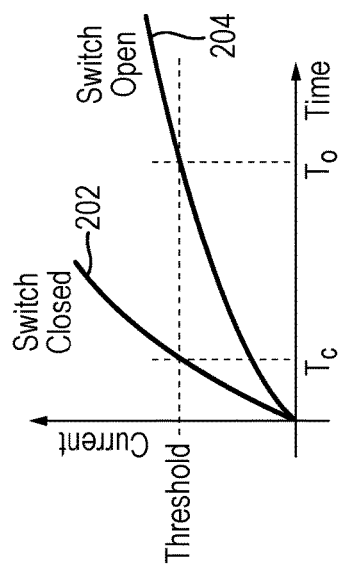
FIG. 2 is a graph showing typical rates of change of the current that can be measured by the device when an external switch of the target circuit is closed and when the external switch is open.

FIG. 2 is a graph illustrating typical rates of change of the current at the primary coil 104A that can be measured by the device 100 when the external switch 108 is closed (line 202) and when the external switch is open (line 204).

Therefore, by measuring the time taken for the current at the primary coil 104A to reach a predetermined threshold value after the closure of the current control switch 112, the state of the target circuit 106 can be determined and indicated by the device 100. The predetermined threshold value can be any current level that will be reached during normal use of the device. The timer and control circuit 122 of the device can compare the measured time with a stored value that represents, for example, the time taken (e.g. obtained by experiments) for the threshold current to be reached when the external switch 108 is open (or there is no/low voltage in the target circuit). If the result of the comparison is that the measured time is less than this stored time value then a signal is generated indicating that a high voltage state has been detected in the target circuit.

Following this measurement process, the current control switch 112 is opened and any residual flux in the transformer 102 can be reset by the fly-back diode 115 and the device 100 is then prepared for the next measurement cycle. Thus, embodiments of the device effectively use an indirect measurement of the impedance at the primary coil 104A of the transformer to determine the switch 108 open/closed state of the target circuit. It will be appreciated that alternative measurement(s)/signal processing can be used to sense the circuit state. For instance, the device may compare the measured time with a stored value that represents the time taken for the current at the primary coil to reach a threshold value when the external switch 108 is closed, and if the result of that comparison is that the measured time is equivalent to the stored time value then a signal can be generated indicating that a high voltage state has been detected in the target circuit. In other embodiments, a different type of measurement may be taken, e.g. a sensing resistor can be used to directly measure the inductance or impedance at the primary coil and the device uses that measurement to determine the state of the target circuit and produces a suitable output signal accordingly.

By designing the transformer 102 such that there is a relatively small number of turns on the secondary coil 104B, any voltage generated at the output terminals after the current control switch 112 is closed can be kept low, but the output impedance is then such that the current flowing when the external switch 108 is closed will be relatively high, which can be desirable as it can provide "wetting" to ensure that the switch contacts remain clean. The number of turns of the primary and the secondary coils will be determined on an application-specific basis and, in general, will be selected so that, in use, the measurement of a current, rather than a voltage, at the primary coil can be used to determine the state of the target circuit.

It may be possible to change electrical impedance characteristics (voltage vs. current) by adjusting the ratio of turns of the primary coil 104A to the secondary coil 104B of the transformer 102. For applications requiring a low voltage, high current sense a small number of turns will be needed on the secondary with respect to the primary. The use of a low voltage can be an advantage if the state of a Power FET is being sensed (see embodiment of FIG. 6 below)—this can ensure that the sense voltage is less than the forward voltage of the intrinsic body diode within the FET that would otherwise (if a high sense voltage is used) appear to conduct even if the FET element itself is turned off.

As the state sensing circuit 100 is totally isolated, the external switch 108 may be either floating or referenced to ground and hence operate in a single ended mode.

The timer and control circuit 122 can be a relatively simple function that may be conveniently implemented in an FPGA, but is also well suited to implementation within a small, low power, microcontroller, such as an AVR or PIC, which would also provide the system interface, e.g. serial data from a UART, SPI or I$^2$C, with minimum design effort. Some of these devices include analogue comparator functions that could be used to detect the current threshold and hence reduce the component count of embodiments of the device 100.

Figure 3:
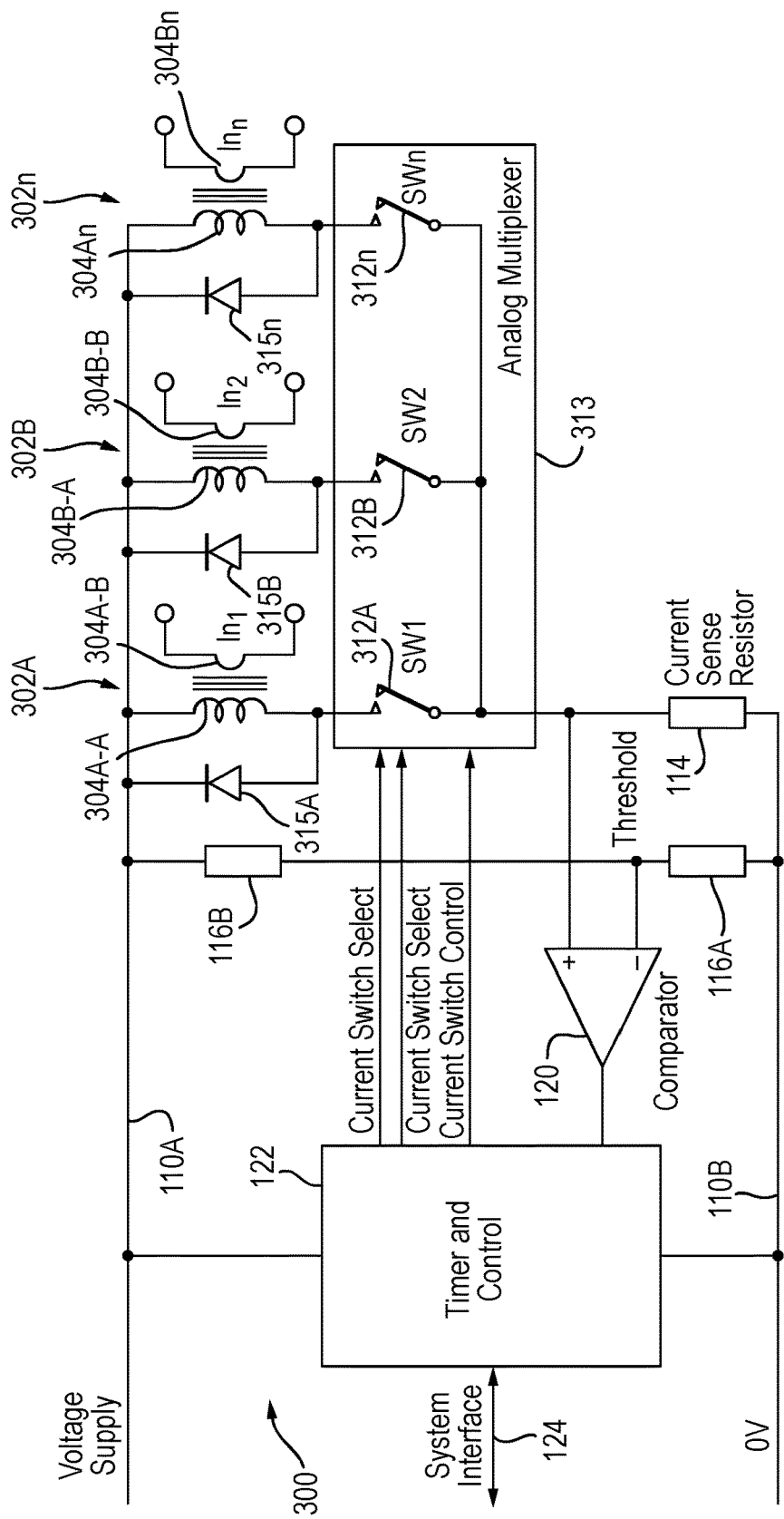
FIG. 3 is a diagram of a second embodiment of a circuit state sensing device.

The example device 100 of FIG. 1 includes only a single interface for sensing the state of a single external switch in a single target circuit 106; however, this can be easily extended by connecting several transformer circuits to a single current sense and timing circuit, using, for example, an analogue multiplexer device as the switching element for the individual transformers. An example device 300 of this type is shown in FIG. 3. To avoid unnecessary repetition, components substantially corresponding to those of the embodiment of FIG. 1 have been given the same reference numerals in FIGS. 3 to 5 and will not be described again in detail.

In the example device 300 of FIG. 3, there are a plurality of transformers 302A, 302B, . . . , 302n, each having an associated fly-back diode 315A, 315B, . . . , 315n. The primary coil 304A-A, 304A-B, 304A-n of each of these transformers is connected to a respective current control switch 312A, 312B, . . . , 312n, which together form an analogue multiplexer device 313. The switches are controlled by a single current sense and timing circuit 322 (although it will be understood that individual circuits could be provide in alternative embodiments). The secondary coil 304B-A, 304B-B, . . . , 304B-n of each transformer is connected to a respective target circuit forming inputs $In_1$, $In_2$, . . . , $In_n$ for which states are to be sensed.

In the example device 300 of FIG. 3, the control function provided by the circuit 122 can sequence through all of the current control switches 312A, 312B, 312n to obtain the status of all of the inputs $In_1$, $In_2$, $In_n$. This is very time efficient as the flux reset period of one circuit can be set to coincide with the measurement cycle of the other inputs, ensuring that the device will be ready at the start of the next cycle. It will be appreciated that other embodiments may vary, e.g. a different control circuit may be provided for at least one of the current control switches; however, the arrangement of FIG. 3 can reduce component count.

One possible disadvantage of the configuration of FIG. 3 may be that addressing faults within the analogue multiplexer 313 or control circuit 322 could result in the incorrect input being read (this is no different to more conventional circuits that use multiplexing techniques); however, this can be mitigated by connecting unused switches to known states, e.g. connected directly to the supply rail 110A or a left-open circuit, such that a built-in test function that can determine that the incorrect address is being selected. Moreover, the actual rise time of the current can be analysed to ensure that the correct inductance is being measured, which will not be the case, for example, if the transformer primary coil or switch element has failed, is an open circuit or is shorted to another.

Figure 4:
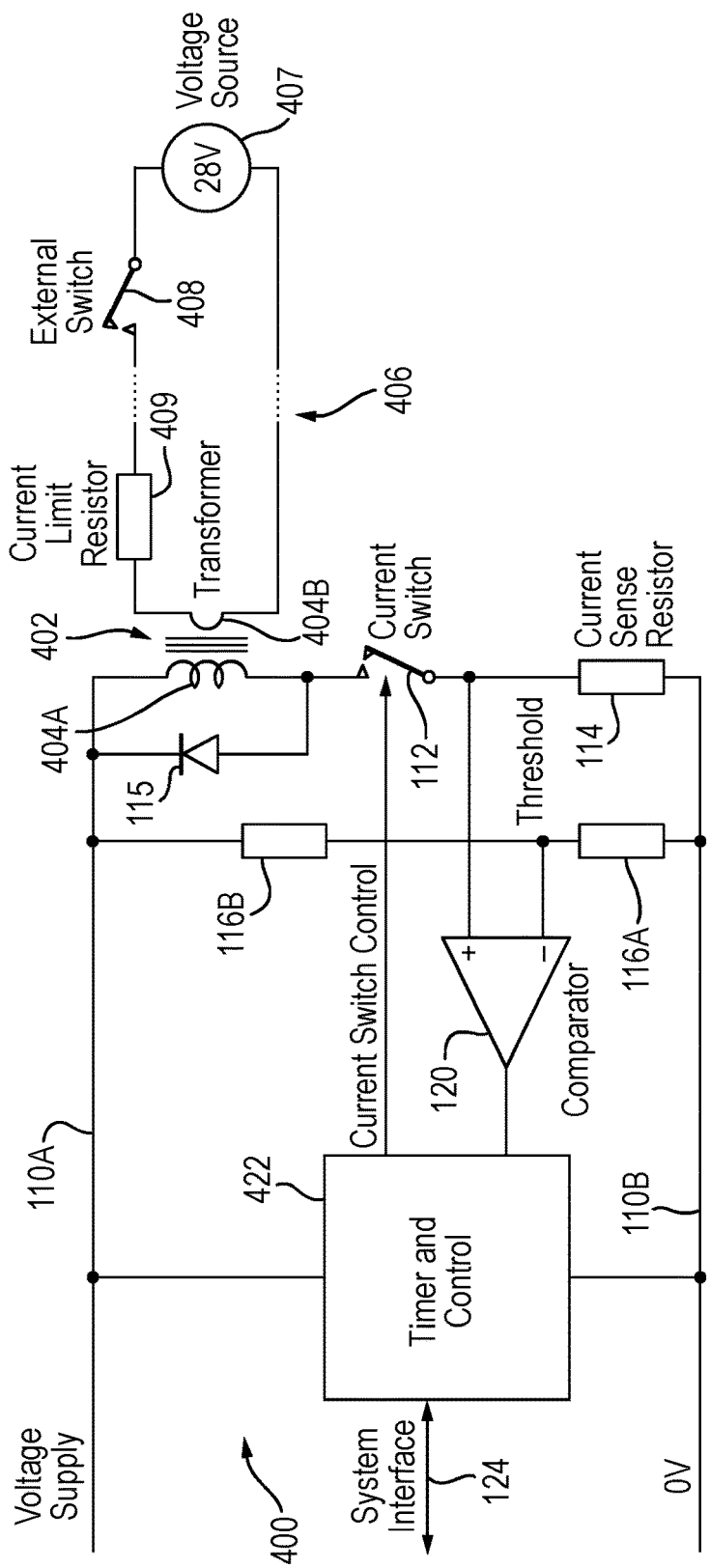
FIG. 4 is a diagram of a third embodiment.

The embodiments described so far have considered sensing the state of a target circuit in the form of simple discrete switch closures; however, embodiments can be provided that sense different types of target circuit states; for example, the voltage sensing device 400 shown in FIG. 4.

In the example device 400 of FIG. 4, the target circuit 406 includes a voltage source 407. A current limit resistor 409 has been added to the target circuit, between its voltage source and switch 408. The value of this current limit resistor is chosen to set a current through the secondary coil 404B of the transformer 402 at a high enough value to ensure saturation of the core when the minimum expected voltage is applied to the input/target circuit. This will have a similar effect as shorting the input did in the examples described above. When the input voltage is removed, or falls to a low value that is insufficient maintain saturation of the core, the device 400 will detect an open circuit condition as described above and hence be able to differentiate between the two states. Although a typical input of 28V DC is shown in the example, it is possible to configure the device for operation with other voltages and, with suitable filtering in the control circuit 422 or conversion to result in what would be effectively a DC voltage across the secondary coil 404B, may be able to sense AC voltages; for example, sensing the status of input power to the equipment, where the inherent isolation of the circuit will be very advantageous.

Figure 5:
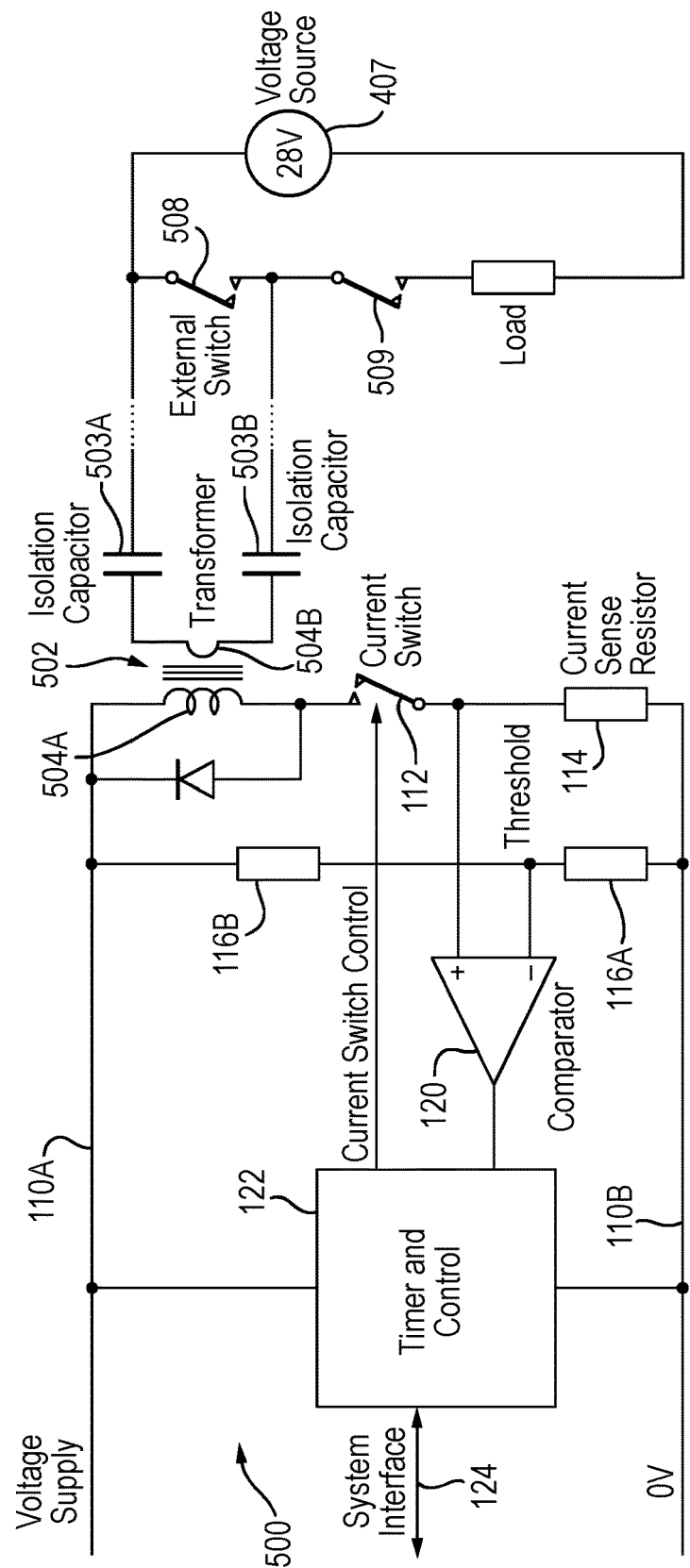
FIG. 5 is a diagram of a fourth embodiment.

FIG. 5 shows an embodiment of the device 500 that can act as a power switch monitor in a switching system that uses two or more series switch elements for integrity in safety critical applications. In this embodiment the external switch 508, the state of which is to be sensed, is connected to the secondary coil 504B of the transformer 502 via isolation capacitors 503A, 503B that prevent the switch being shorted by the secondary coil. Two such isolation capacitors are shown in the example in order to provide a high degree of fault tolerance in high integrity applications. The value of each of these capacitors must be large enough to ensure that they have low impedance at the operating frequency of the device such that when the external switch is closed, a shorted condition is detected. A significant advantage of this configuration is that it will operate correctly regardless of whether or not the input supply and/or or a load current is flowing. Furthermore, the monitor current flowing through the switch is contained within the transformer loop and not in the load, which is intrinsically safe. The circuit can therefore be used to monitor switching circuits to determine their serviceability before potentially dangerous power is applied. In addition, another instance of the circuit can be used to monitor the second series switch 509 of the example of FIG. 5.

Although the examples described herein show the items to be sensed as being simple mechanical switches, other embodiments of the device have been demonstrated to operate correctly with semiconductor switching elements, such as power FETs. However, in these cases the device was designed such that the open circuit secondary transformer voltage is high enough to ensure that it is sufficient to overcome the saturation voltage of the device before it starts to conduct, but low enough to ensure that the intrinsic body diode of a FET switching element does not conduct, which may otherwise be indicated as a false switch closure.

Figure 6:
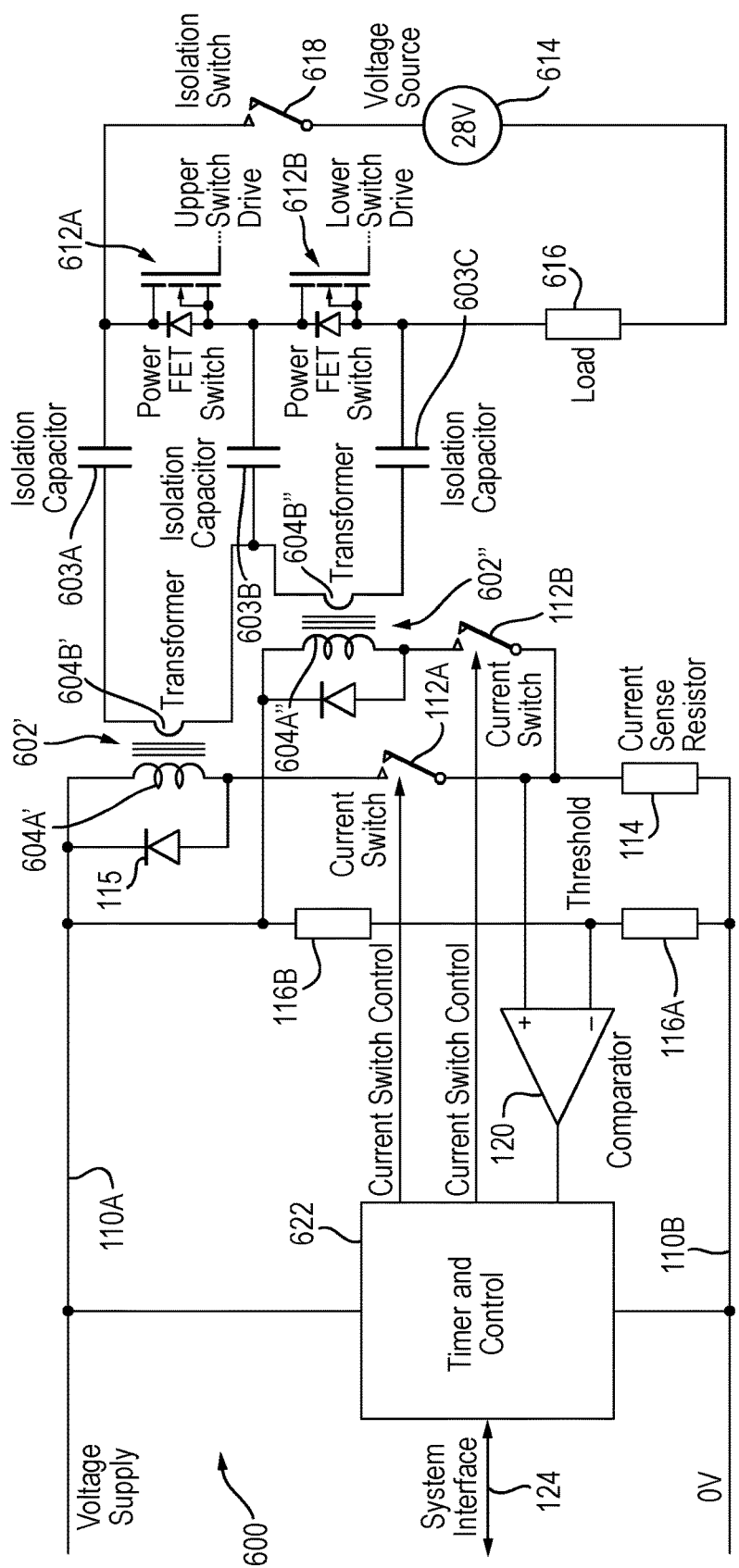
FIG. 6 is a diagram of a fifth embodiment.

FIG. 6 shows an embodiment of the device 600 that can be used to monitor a high integrity, dual FET switch 612A, 612B (each having a parasitic body diode) to control the application of power from a source 614 to a safety critical load 616. The upper FET switch 612A is associated with a first transformer 602', having primary 604A' and secondary 604B' coils. The lower FET switch 612B is associated with a second transformer 602", having primary 604A" and secondary 604B" coils. Isolation capacitors 603A-603B are connected between the first and second transformers and the two FET switches.

In use, the device 600 will report the state of both FET switches 612A, 612B, while the switch drive circuit 622 performs the following (example) switch sequence:

a) set both switches 612A, 612B off and check monitor shows both off;

b) switch upper switch on 612A and check monitor shows upper on/lower 612B off;

c) set both switches 612A, 612B off and check monitor shows both off;

d) switch lower switch 612B on and check monitor shows upper 612A off/lower on;

e) set both switches 612A, 612B off and check monitor shows both off;

These checks can be performed before a main isolation switch 618 is closed. An important feature of this embodiment of the device 600 is that it works regardless of whether or not power is applied to, or current is flowing through, the switches 612A, 612B being monitored. The correct operation of each switch can be independently verified prior to applying the 28V power 614 to the switch network via the isolation switch 618. This can minimise the risk of the inadvertent application of power to the load.

It will be apparent to the skilled person that the examples described herein can be combined or adapted in various ways to satisfy the needs of any particular application. For example, individual devices in a multiplexed configuration can be configured as voltage monitors or switch closure detection as required. Embodiments of the device offer a flexible, scalable, rugged and low power solution to many different discrete input sensing requirements. Embodiments of the device can either be manufactured as an integral part of an electrical component to sense its state, or be added/retro-fitted onto an existing component.

At least some embodiments of the invention may be constructed, partially or wholly, using dedicated special-purpose hardware. Terms such as 'component', 'module' or 'unit' used herein may include, but are not limited to, a hardware device, such as a Field Programmable Gate Array (FPGA) or Application Specific Integrated Circuit (ASIC), which performs certain tasks. Alternatively, elements of the invention may be configured to reside on an addressable storage medium and be configured to execute on one or more processors. Thus, functional elements of the invention may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Further, although the example embodiments have been described with reference to the components, modules and units discussed below, such functional elements may be combined into fewer elements or separated into additional elements.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A circuit state sensing device, comprising:
   a plurality of transformers each having a primary coil and a secondary coil, in use, each of the secondary coils being connected to an associated one of a plurality of target circuits for which a state is to be sensed;
   a measuring arrangement configured to take measurements relating to impedance at the primary coil of each of the transformers; and
   a processing arrangement configured to process the measurement to determine a state of each of the target circuits.

2. The device according to claim 1, further including a current providing arrangement configured to selectively provide a current to the primary coil of at least one of the transformers.

3. The device according to claim 2, further including a resetting arrangement configured to reset residual flux of at least one of the transformers.

4. The device according to claim 3, wherein the measuring arrangement includes an arrangement configured to measure a time taken for the current provided to the primary coil of a said transformer by the current providing arrangement to reach a predetermined current value.

5. The device according to claim 4, wherein the processing arrangement includes:
   a comparison arrangement configured to compare the time measured by the measuring arrangement with a stored time value, and
   an output arrangement configured to generate an output signal based on a result provided by the comparison arrangement.

6. The device according to claim 5, wherein the stored time value represents time taken for the current at the primary coil of a said transformer to reach the predetermined current value when a rate of change of the current at the primary coil is effectively limited by a current sense resistor connected to the primary coil of said transformer.

7. The device according to claim 1, where, in use, at least one of the target circuits includes a switch, wherein the device is configured to sense an open/closed state of the switch.

8. The device according to claim 1, where, in use, at least one of the target circuits includes a voltage source, wherein the device is configured to sense a voltage state of the respective target circuit(s).

9. The device according to claim 1, further including:
   a plurality of current providing arrangements each configured to selectively provide a current to the primary coil of an associated one of the transformers;
   a plurality of resetting arrangements each configured to reset residual flux of an associated one of the transformers;
   wherein the measuring arrangement includes an arrangement configured to measure a time taken for the current provided to the primary coil of a said transformer by the associated current providing arrangement to reach a predetermined current value.

10. The device according to claim 9, wherein the plurality of current providing arrangements include a plurality of current control switches arranged as an analogue multiplexer.

11. The device according to claim 1, where, in use, at least one of the target circuits includes a voltage source and a current limit resistor, wherein a value of the current limit resistor is chosen to set a current through the secondary coil of the respective transformer at a value sufficient to ensure saturation of a core of the respective transformer when a minimum expected voltage is applied to the respective target circuit.

12. The device according to claim 1, wherein at least one of the target circuits includes a power switch that, in use, is connected to the secondary coil of the respective transformer via at least one isolation capacitor, and wherein the device is configured to sense the state of the power switch.

13. The device according to claim 2, wherein the device is configured to monitor states of a plurality of FET switches that control power from a source to a safety critical load, each said FET switch being associated with a respective said transformer and, in use, the device monitors states of the FET switches by using the current providing arrangement to selectively provide a current to the primary coil of one or more of the transformers in a sequence, and checking if the state of each said FET switch corresponds to an expected state based on the current provided by the sequence.

14. A method of sensing a state of a circuit, the method including:
   providing a plurality of transformers each having a primary coil and a secondary coil;
   connecting each of the secondary coils, in use, to an associated one of a plurality of target circuits for which a state is to be sensed;
   taking a measurement relating to impedance at each of the primary coils; and
   processing the impedance measurement to determine a state of each of the target circuits.

15. A circuit state sensing device, comprising:
   a plurality of transformers each having a primary coil and a secondary coil, in use, each of the secondary coils being connected to an associated one of a plurality of target circuits for which a state is to be sensed;
   a switch circuit connected in series with the primary coil of each of the target circuits; and
   a controller circuit configured to control the switch circuit and take a measurement relating to impedance at the primary coil of each of the transformers when the switch circuit is engaged so as to allow current flow through the primary coil of each of the transformers, the controller circuit further configured to process the measurement to determine a state of each of the target circuits.

16. The device according to claim 15, further comprising at least one of:
   a power supply operatively coupled to at least one of the transformers so as to provide a current to the primary coil of each respective transformer; and
   a fly-back diode connected across the primary coil of the at least one of the transformers.

17. The device according to claim 15, further comprising:
   a current sense resistor connected to the primary coil of at least one of the transformers;
   wherein the controller circuit is a microcontroller configured for measuring a time taken for current provided to the primary coil of the respective transformer(s) to reach a predetermined current value, the microcontroller including a comparator circuit configured to compare the measured time with a pre-established time value, and to generate an output signal based on the comparison, wherein the pre-established time value represents time taken for the current at the primary coil of the respective transformer(s) to reach the predetermined current value when a rate of change of the current at the primary coil of the respective transformer(s) is effectively limited by the current sense resistor connected to the primary coil of the respective transformer(s).

18. The device according to claim 15, further comprising:
   a current sense circuit connected to the primary coil of at least one of the transformers;
   wherein the controller circuit is configured for measuring a time taken for current provided to the primary coil of the respective transformer(s) to reach a predetermined current value, the controller circuit including a comparator circuit configured to compare the measured time with a pre-established time value, and to generate an output signal based on the comparison, wherein the pre-established time value represents time taken for the current at the primary coil of the respective transformer(s) to reach the predetermined current value when a rate of change of the current at the primary coil of the respective transformer(s) is effectively limited by the current sense circuit connected to the primary coil of the respective transformer(s).

19. The device according to claim 15, where, in use, at least one of the target circuits includes at least one of:
   a current control switch, wherein the device is configured to sense an open/closed state of the current control switch;
   a voltage source, wherein the device is configured to sense a voltage state of the target circuit;
   a voltage source and a current limit resistor, wherein a value of the current limit resistor is chosen to set a current through the secondary coil of at least one of the transformers at a value sufficient to ensure saturation of a core of the respective transformer(s) when a minimum expected voltage is applied to the respective target circuit(s);
   a power switch, wherein the device is configured to sense a state of the power switch wherein, in use, the power switch is connected to the secondary coil of the respective transformer(s) via at least one isolation capacitor; and
   a FET switch that controls power from a source to a safety critical load, wherein the device is configured to monitor a state of the FET switch by selectively providing a current to the primary coil of the respective transformer(s), and to check via the controller circuit whether a state of said FET switch corresponds to an expected state based on the current provided to the primary coil of the respective transformer(s).

* * * * *